INVENTOR.
SARKIS NERCESSIAN
BY JOHN KIVIRANNA
Alfred W. Barber
ATTORNEY

POWER OUTPUT STAGE FOR BIPOLAR OPERATIONAL POWER SUPPLY

Filed Feb. 7, 1969 2 Sheets-Sheet 2

INVENTOR.

SARKIS NERCESSIAN
BY JOHN KIVIRANNA

Alfred W. Barber

ATTORNEY 3,566,292
POWER OUTPUT STAGE FOR BIPOLAR OPERATIONAL POWER SUPPLY

Sarkis Nercessian, Long Island City, and John Kiviranna, Flushing, N.Y., assignors to Forbro Design Corp., New York, N.Y., a corporation of New York
Filed Feb. 7, 1969, Ser. No. 797,464
Int. Cl. H03f 3/04, 3/18
U.S. Cl. 330—22 10 Claims

ABSTRACT OF THE DISCLOSURE

A bipolar operational power supply is provided with a differential output circuit including means for limiting the output current which is compatible with both NPN and PNP output transistor amplifier transistors and with AC feedback in the voltage amplifier which drives the output.

BACKGROUND OF THE INVENTION

Description of prior art

Regulated power supplies have been built in the past for supplying undirectional power to a load. Most power supply applications have been for such unidirectional power. Circuits which have been developed for such unidirectional applications generally present particular problems when an attempt is made to extend them to differential or bioplar operation.

The problems presented in bipolar power supplies include countering the differences which exist between NPN and PNP transistors; the problem of cross-over distortion; the problem of current limiting which is not the same for both polarities of output; and the problem of current limiting in an amplifier with AC feedback among others. One of the particular problems encountered in a high power output differential power supply is that of stability in the final power stage which may have only unity voltage gain which cannot create instability but which may have very high current gain capable of producing instability when supplying certain types of load impedances.

SUMMARY

In accordance with the present invention provisions are made in a complementary output power stage for overcoming the problems mentioned above. One of the major differences between commercial NPN and PNP silicon power transistors is that at a given current the PNP transistors are capable of sustaining safely as great a voltage as like NPN transistors. This problem has been met in a complementary power amplifier by arranging two PNP transistors in series in the output stage.

Cross-over distortion has been substantially eliminated by providing a predetermined forward drive on both the NPN and the PNP transistors making up the complementary output stage. This forward drive includes components equal to the emitter to base drops of both sets of transistors plus a component to insure forward conduction at any input drive level.

Since excessive current can be drawn in either of two polarities, independent current limiting means have been provided. The current limiting means are particularly adapted to the method in which the two types of transistors are driven. The limiting applied to the NPN transistors acts to limit the drive from the voltage amplifier whenever the output or load current exceeds a predetermined level. The limiting circuit is decoupled from the output of the voltage amplifier in a manner which prevents reaction with the AC feedback circuit which would otherwise cause oscillation of the system. Since the drive of the PNP transistors is provided through a constant current generator, current limiting in this section is provided by starving the current source in the presence of excess output or load current.

While the complementary power output amplifier is essentially an emitter follower configuration and hence has a voltage gain never more than unity and on the basis of voltage feedback must always be stable, it has a very high current gain capable of producing instability under certain load conditions. In order to prevent the system from becoming unstable under any load conditions, it has been found that a small series resistor permanently connected in series with the load will provide this insurance.

With the above provisions a high power bipolar output power stage has been provided which is stable under all load conditions, has substantially no cross-over distortion, uses NPN and PNP transistors in an optimum manner and incorporates over current limiting on both positive and negative excursions.

BRIEF DESCRIPTION OF THE DRAWING

FIG. 1 is a simplified schematic partly in block form of a bipolar power supply in accordance with the parent invention shown and described in the above referred to application. This power supply includes a voltage amplifier 1, having an inverting input terminal 2, a common terminal 3 and an output terminal 4 driving a push-pull (bipolar) power amplifier 5 at input terminal 6 and driving a load 9 connected across output terminals 7 and 8.

Figure 1:
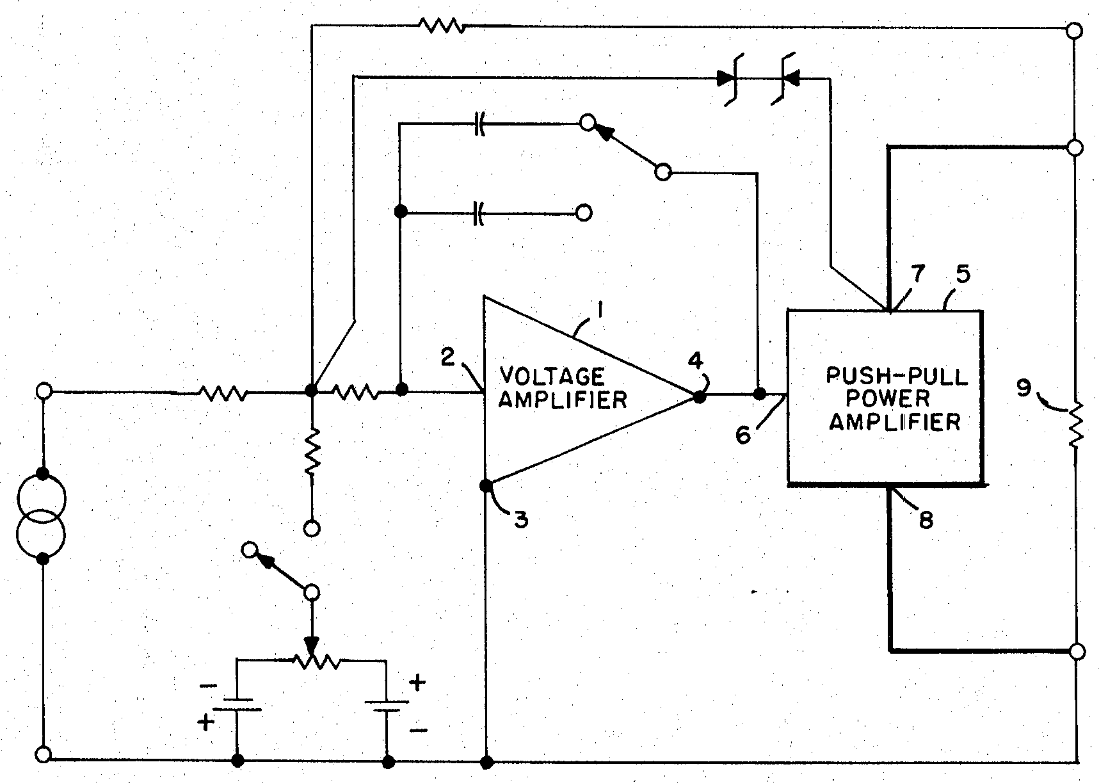
FIG. 1 is taken from the parent application and illustrates the general organization of a power supply in accordance with the present invention.

The present invention is particularly concerned with methods of and means for providing a high power, stable, low distortion and current limited power amplifier portion of the bipolar power supply and compatible with the overall organization shown in FIG. 1 and described and claimed in the parent application identified above.

Figure 2:
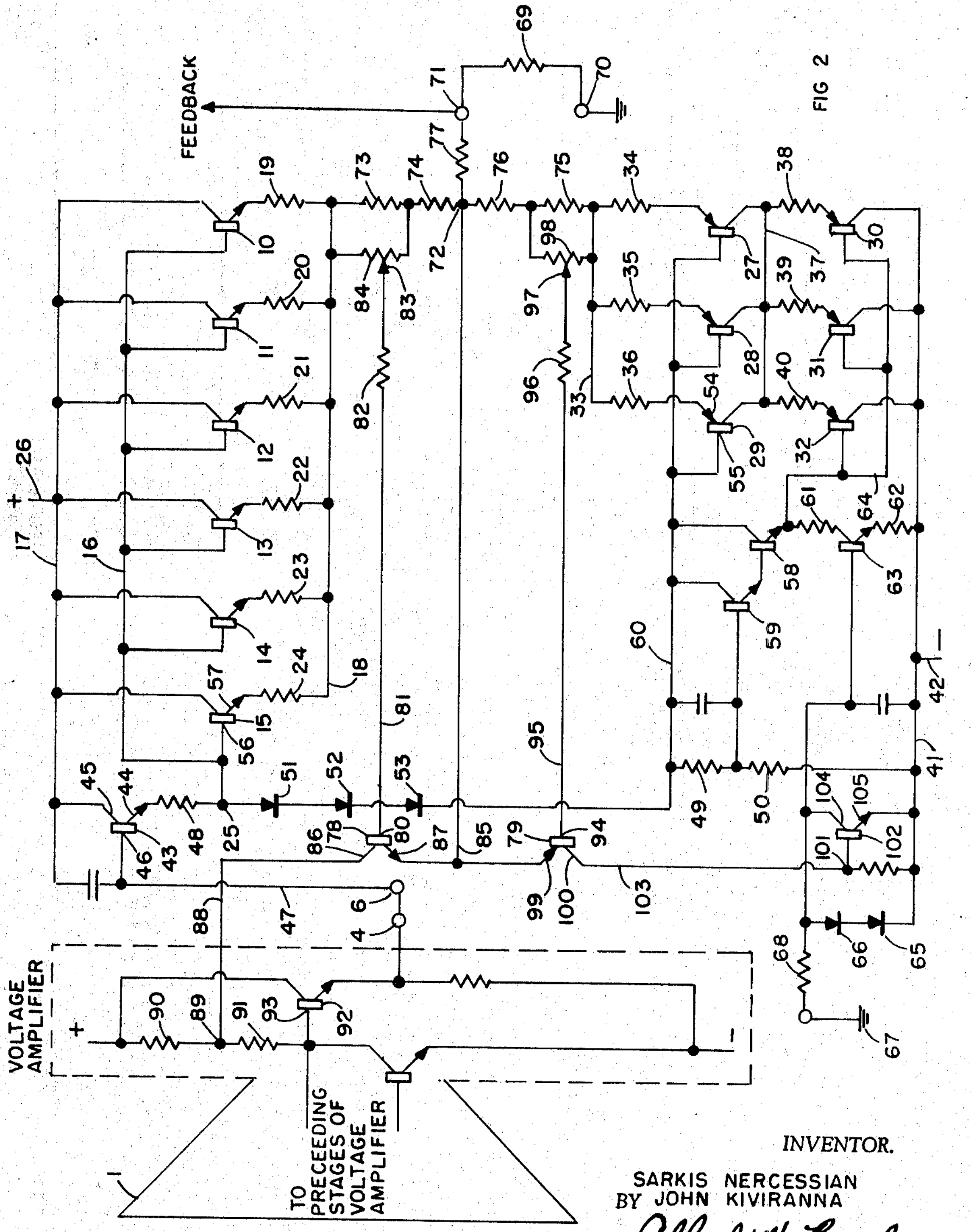
FIG. 2 is a detailed schematic circuit diagram of a complementary power output stage of a bipolar power supply in accordance with the present invention.

FIG. 2 is a detailed schematic circuit diagram of one form of the present invention embodying a complementary power amplifier. This amplifier includes a plurality of NPN transistors 10, 11, 12, 13, 14 and 15 driven in parallel by signals applied to the common lead 16 connected to all of the bases by signals applied at 25. All collectors are connected in parallel to common lead 17 which in turn is connected to a suitable source of positive voltage (not shown) over lead 26. The emitters are returned to a common lead 18 through current equalizing resistors 19, 20, 21, 22, 23 and 24 respectively. In a complementary power amplifier two sets of complementary transistors are used, one carrying positively going voltage and current and the other carrying negatively going voltage and current. In the present case, the positively going voltage and current is carried by the parallel connected NPN transistors just described. In order to carry equal negatively going voltage and current, a group of series parallel connected PNP transistors 27, 28, 29, 30, 31 and 32 is used since it has been found more economical to group available PNP transistors in this manner. These PNP transistors are connected with transistors 27 and 30 in series, 28 and 31 in series and 29 and 32 in series. The emitters of transistors 27, 28 and 29 are connected to common lead 33 through current equalizing resistors 34, 35 and 36 respectively; while the corresponding collectors are connected in parallel to common lead 37; the emitters of transistors 30, 31 and 32 are returned to common lead 37 through current equalizing resistors 38, 39 and 40; and the corresponding collectors are connected in parallel to negative lead 41 which in turn is connected to a suitable source of negative voltage (not shown) over lead 42. Thus, two groups of transistors are provided, one a group of NPN transistors for positively going voltage and current and the other a group of PNP transistors for negatively going voltage and current.

The two groups of transistors are driven from the voltage amplifier 1 (see FIG. 1 for the general organization) having an output terminal 4 by signals applied to input terminal 6 of the power amplifier. The complementary groups of transistors are driven from a single NPN driver transistor 43 which has an emitter 44, a collector 45 and a base 46. Input signals are applied from input terminal 6 over lead 47 to base 46. Collector 45 is connected to the source of positive voltage over lead 17. Emitter 44 is returned to the source of negative voltage carried by lead 41 through resistors 48, 49 and 50 and diodes 51, 52 and 53 all connected in series. Resistors, 48, 49 and 50 are chosen to provide symmetrical drive voltages to the NPN and PNP groups of transistors. Diodes 51, 52 and 53 are used to insure low crossover distortion by providing first a voltage drop to counter the drop between emitter 54 and base 55 of transistor 29; second a drop to counter the drop between emitter 57 and base 56 of transistor 15 (each being substantially equal to the drop across one diode) and an additional drop to ensure forward bias on at least one group of transistors at all times.

The second group of PNP transistors (30, 31 and 32) is driven by a follower circuit employing transistor 58 current driven by transistor 59 and bridged between signal line 60 and negative line 41 through resistors 61 and 62 and constant current transistor 63. This circuit divides the voltage between signal line 60 and negative line 41 substantially in half at base drive line 64 so that the two groups of PNP transistors equally divide the voltage on the negatively going voltage excursions. The constant current provided by transistor 63 is equal to the voltage drop provided by diodes 65 and 66 connected between negative line 41 and ground or common 67 through resistor 68 divided by the resistance value of emitter resistor 62.

Power fiom the groups of NPN and PNP transistors is supplied to a load 69 connected between load terminal 71 and ground or common terminal 70. Considering junction 72 as the symmetrical drive point, emitter line 18 is connected to junction 72 through resistors 73 and 74 while emitter line 33 is connected through resistors 75 and 76. The additional resistor 77 is provided between junction 72 and high load terminal 71. The value of resistor 77 is chosen so that when combined with the other resistance effectively in series with the banks of power transistors, no load impedance across terminals 70–71 can produce instability of these current amplifiers.

Dynamic current limiting is also provided, a particularly useful concept for protecting the power transistors in case of a short circuit across load terminals 70–71. Transistors 78 and 79 are the active coupling devices for the dynamic current limiting. Input voltage is applied to base 80 of transistor over lead 81 through base current limiting resistor 82 from adjustable contact 83 of potentiometer 84 which in turn is connected across resistor 73. Since transistor 78 is an NPN transistor it becomes conductive upon the application of a sufficiently positive voltage between its base 80 and emitter 87 returned to junction 72 over lead 85. Thus, as current through the bank of NPN power transistors increases, the voltage at 83 becomes more positive and at some point sends transistor 80 into conduction. Adjustment of c ontact 83 provides means for setting the conduction point of base 80 for a range of current values while resistor 74 determines the maximum current which can be so chosen. When transistor 78 is rendered conducting by excess current as set forth above, collector 86 connected over lead 88 to junction 89 between resistors 90 and 91 effectively clamps junction 89 to the potential of junction 72 and robs base 93 of output transistor 92 of bias or driving voltage. Under these conditions transistor 92 cannot call for more current from the bank of NPN power transistors and the positively going current to the load terminals from these transistors is effectively limited.

While the above described circuit action is effective in limiting the positively going output current, a different type of limiting circuit has been designed for negatively going current from the PNP power transistors. Control is initiated in PNP transistor 79. Base 94 is connected over lead 95, through base current limiting resistor 96 to adjustable contact 97 of potentiometer 98 which in turn is connected across resistor 75. Emitter 99 is returned over lead 85 to junction 72. Transistor 79 becomes conducting when base 94 becomes sufficiently negative with respect to emitter 99. Thus, the conduction point may be determined by adjustment of contact 97 and is limited as to maximum current setting by resistor 76. When transistor 79 becomes conducting due to more than a predetermined negatively going current through the bank of PNP power transistors, collector 100 connected over line 103 to base 101 of transistor 102 clamps the potential of base 101 to that of terminal 72. Since this is highly positive with respect to negative line 41, transistor 102 is rendered highly conducting and the conductive path from collector 104 to emitter 105 effectively shorts the voltage across diodes 65 and 66 robbing transistor 63 of its base drive voltage. With greatly lowered base drive, transistor 63 can supply only a small part of the normally required constant current to the drive circuit of the PNP power transistors and the negatively going output current is thereby effectively limited.

While the invention has been described with NPN transistors in certain portions of the circuit and PNP transistors in other portions, the transistors may be interchanged i.e. all PNP transistors may be NPN transistors and all NPN transistors may be PNP transistors, along with the substitution of positive for negative and negative for positive voltages and the reversal of direction of all diodes without departing from the invention described above.

What is claimed is:

1. In a bipolar transistor power amplifier, the combination of;

a complementary output circuit means including a plurality of parallel connected NPN transistors and a plurality of parallel connected PNP transistors;

an output terminal;

first output current sensing resistive means connected between said output terminal and said NPN transistors;

second output current sensing resistive means connected between said output terminal and said PNP transistors;

whereby output current of one polarity flows through said first resistive means providing a first current responsive voltage drop and output current of the opposite polarity flows through the second said resistive means providing a second current responsive voltage drop;

bipolar amplifier means coupled to said output circuit for amplifying bipolar signals to drive said NPN and PNP transistors;

a first current limiting means comprising an NPN transistor including a base, an emitter and a collector connected in the circuit with said emitter connected to said output terminal, said base connected to receive at least a portion of said first voltage drop and said collector connected to said bipolar amplifier coupling means, said first current limiting transistor being responsive to positive going voltages of said first voltage drop and limiting the positive going drive to said NPN transistors to a predetermined maximum;

a second current limiting means comprising a PNP transistor including a base, an emitter and a collector connected in the circuit with said emitter connected to said output terminal, said base connected to receive at least a portion of said second voltage drop and said collector connected to said bipolar amplifier coupling means, said second current limiting transistor being responsive to negative going voltages of said second voltage drop and limiting the positive going drive to said PNP transistors to a predetermined maximum;

whereby the positive and negative going currents to said output terminal from said NPN and PNP transistors are independently limited.

2. A bipolar power amplifier output current limiting circuit as set forth in claim 1;

and including a transistor (92) for amplifying signals to drive said NPN and PNP transistors including a collector, a base and an emitter;

means for applying signals to said base;

means for coupling to said NPN and PNP transistors connected to said emitter;

two resistors connected in series between said base and a source of collector supply voltage;

wherein said first current limiting transistor is coupled to the junction between said resistors for limiting the voltage to said base in response to excessive current flowing to said output terminal.

3. A bipolar power amplifier output current limiting circuit as set forth in claim 1;

and including an amplifier transistor (92) for driving said NPN and PNP transistors;

and coupling means between said first current limiting transistor and said amplifier transistor for reducing the input to said amplifier transistor in response to excessive current flowing to said output terminal.

4. A bipolar power amplifier output current limiting circuit as set forth in claim 1;

and including additional resistive means (77) connected in series with said output terminal for stabilizing said power supply for predetermined load impedance conditions.

5. A bipolar amplifier output current limiting circuit as set forth in claim 1;

wherein said NPN transistors are connected in parallel and said PNP transistors are connected in series parallel combination.

6. A bipolar power amplifier output current limiting circuit as set forth in claim 1;

wherein said first and second resistive means are adjustable.

7. A bipolar power amplifier output current limiting circuit as set forth in claim 1;

wherein the input circuit to said PNP transistors includes a transistor connected as a source of constant current.

8. A bipolar power amplifier output current limiting circuit as set forth in claim 2;

and including a driver transistor (43) connected between said emitter and said NPN and PNP transistors.

9. A bipolar power amplifier output current limiting circuit as set forth in claim 1;

wherein said power amplifier is DC coupled.

10. A bipolar power amplifier output current limiting circuit as set forth in claim 1;

and including means for providing a forward bias to both said NPN and PNP transistors.

References Cited

UNITED STATES PATENTS 3,042,876 7/1962 Degram ............ 330—30X

ROY LAKE, Primary Examiner

L. J. DAHL, Assistant Examiner

U.S. Cl. X.R.

330—17, 30